United States Patent
Yang et al.

(10) Patent No.: US 8,799,556 B2
(45) Date of Patent: *Aug. 5, 2014

(54) ADAPTIVE READ AND WRITE SYSTEMS AND METHODS FOR MEMORY CELLS

(75) Inventors: Xueshi Yang, Cupertino, CA (US); Gregory Burd, San Jose, CA (US)

(73) Assignee: Marvell World Trade Ltd., St. Michael (BB)

(*) Notice: Subject to any disclaimer, the term of this patent is extended or adjusted under 35 U.S.C. 154(b) by 0 days.

This patent is subject to a terminal disclaimer.

(21) Appl. No.: 13/095,094

(22) Filed: Apr. 27, 2011

(65) Prior Publication Data

US 2011/0202711 A1  Aug. 18, 2011

Related U.S. Application Data

(63) Continuation of application No. 11/932,829, filed on Oct. 31, 2007, now Pat. No. 7,941,590.

(60) Provisional application No. 60/864,468, filed on Nov. 6, 2006, provisional application No. 60/910,325, filed on Apr. 5, 2007.

(51) Int. Cl.
| | |
|---|---|
| G06F 12/00 | (2006.01) |
| G06F 13/00 | (2006.01) |
| G06F 13/28 | (2006.01) |
| G11C 16/28 | (2006.01) |
| G11C 16/10 | (2006.01) |
| G11C 11/56 | (2006.01) |

(52) U.S. Cl.
CPC ............... *G11C 16/10* (2013.01); *G11C 16/28* (2013.01); *G11C 11/5642* (2013.01); *G11C 11/5628* (2013.01); *G11C 2211/5634* (2013.01)
USPC ................................... 711/103; 711/E12.001

(58) Field of Classification Search
CPC ........... G11C 11/5628; G11C 11/5642; G11C 16/10; G11C 16/28; G11C 16/3418; G11C 16/3431; G11C 2211/5634
USPC .......................................... 711/103, E12.001
See application file for complete search history.

(56) References Cited

U.S. PATENT DOCUMENTS

| | | | |
|---|---|---|---|
| 4,041,456 A | 8/1977 | Ott et al. | |
| 5,414,734 A * | 5/1995 | Marchetto et al. | 375/267 |

(Continued)

FOREIGN PATENT DOCUMENTS

| | | |
|---|---|---|
| KR | 20000016640 | 3/2000 |
| KR | 20030043976 | 6/2003 |

(Continued)

*Primary Examiner* — Sheng-Jen Tsai

(57) ABSTRACT

An apparatus including: a plurality of multi-level memory cells configured to store data, wherein one or more of the multi-level memory cells are designated as pilot memory cells, and wherein each pilot memory cell is configured to store known, pre-determined data; an estimation block configured to, based on the known, pre-determined data, determine (i) estimated mean values of level distributions of the multi-level memory cells and (ii) estimated standard deviation values of level distributions of the multi-level memory cells; and a computation block configured to compute at least optimal or near optimal detection threshold values of level distributions of the multi-level memory cells based, at least in part, on (i) the estimated mean values and (ii) the estimated standard deviation values, wherein the optimal or near optimal detection threshold values are to be used in order to facilitate reading of the data stored in the multi-level memory cells.

19 Claims, 6 Drawing Sheets

(56) References Cited

U.S. PATENT DOCUMENTS

| | | |
|---|---|---|
| 5,734,612 A | 3/1998 | Yoshikawa |
| 5,751,635 A | 5/1998 | Wong et al. |
| 5,825,243 A | 10/1998 | Sato et al. |
| 6,115,285 A | 9/2000 | Montanari et al. |
| 6,224,553 B1 | 5/2001 | Nevo |
| 6,519,264 B1 | 2/2003 | Carr et al. |
| 6,538,922 B1 | 3/2003 | Khalid et al. |
| 6,674,900 B1 | 1/2004 | Ma et al. |
| 6,678,192 B2 | 1/2004 | Gongwer et al. |
| 7,116,597 B1 | 10/2006 | Goldman et al. |
| 7,941,590 B2 * | 5/2011 | Yang et al. ............... 711/103 |
| 8,583,991 B1 * | 11/2013 | Sutardja et al. ............ 714/769 |
| 2002/0196510 A1 | 12/2002 | Hietala et al. |
| 2004/0027958 A1 | 2/2004 | Takeuchi et al. |
| 2006/0142988 A1 | 6/2006 | Akiyama et al. |
| 2006/0161831 A1 | 7/2006 | Mehalel |
| 2007/0076464 A1 | 4/2007 | Koebernick et al. |
| 2007/0245214 A1 | 10/2007 | Ramamoorthy |
| 2008/0092026 A1 | 4/2008 | Brandman et al. |
| 2008/0291724 A1 | 11/2008 | Litsyn et al. |
| 2009/0003073 A1 | 1/2009 | Rizel et al. |
| 2010/0131826 A1 | 5/2010 | Shalvi et al. |

FOREIGN PATENT DOCUMENTS

| | | |
|---|---|---|
| WO | 97/48099 | 12/1997 |
| WO | WO 97/48099 A1 | 12/1997 |
| WO | WO 02/27729 | 4/2002 |
| WO | WO 02/27729 A2 | 4/2002 |

\* cited by examiner

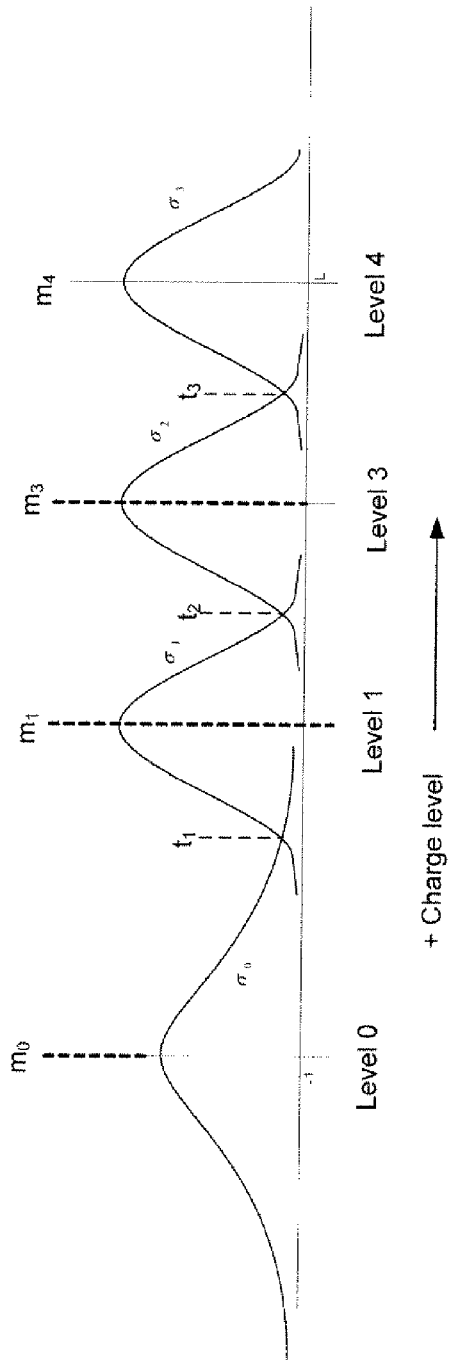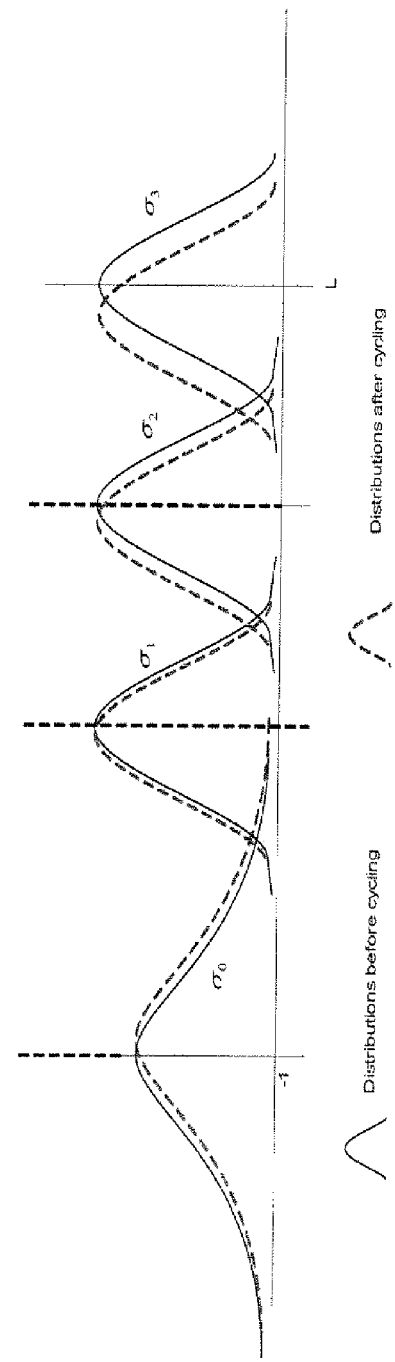

| Block Index | Estimated mean value | Estimated standard deviations | Near optimal or optimal mean values | Near optimal or optimal detection thresholds |
|---|---|---|---|---|
| 0 | $m_0, m_1, \ldots$ | $\sigma_0, \sigma_1, \ldots$ | $\tilde{m}_0, \tilde{m}_1, \ldots$ | $t_1, t_2, \ldots$ |
| 1 | | | | |
| 2 | | | | |
| 3 | | | | |
| ... | | | | |

ADAPTIVE READ AND WRITE SYSTEMS AND METHODS FOR MEMORY CELLS

CROSS-REFERENCES TO RELATED APPLICATIONS

This application is a continuation of U.S. application Ser. No. 11/932,829 (now U.S. Pat. No. 7,941,590), filed on Oct. 31, 2007, which claims priority under 35 U.S.C. §119(e) to: U.S. Provisional Application No. 60/910,325, filed on Apr. 5, 2007, and U.S. Provisional Application No. 60/864,468, filed Nov. 6, 2006.

TECHNICAL FIELD

Embodiments of the present invention relate to the field of data memory devices, and more particularly, to storage and retrieval of data to and from memory cells.

BACKGROUND

Memory cells, such as flash memory cells, may store data by trapping granulized amounts of charge in, for example, an isolated region of a transistor. In such devices, data retrieval from a memory cell is typically made possible by applying a read voltage to the transistor and subsequently estimating the readout current which is determined by the amount of charge trapped in the cell.

An example of a basic type of memory cell is one that may store 1-bit of information. In such a memory cell, the memory cell may hold or not hold a charge to indicate, for example, logic 1 when a charge is stored, and to indicate logic 0, when no charge is stored.

In contrast, "multi-level memory cells" may be able to store more than 1-bit of information by taking advantage of the ability of such memory cells to hold varying amounts of charge or charge levels. For example, suppose the maximum number of trapped charge allowed in a multi-level memory cell is Q. It may then be possible to store more than 1 bit of information in such a cell by storing a granulized amount of charge between 0 and Q, and subsequently estimating the amount of charge stored during readout of the cell. Thus, for example, 2 bits of information may be stored in one multi-level memory cell by trapping any one of, for example, four levels of charges: $0, Q/3, 2Q/3, Q$. This process of trapping charges may be referred to as programming.

In practice, it is often difficult to precisely program a multi-level memory cell with a desired amount of charges. Indeed, the actual programmed amount of charges approximately follows a Gaussian distribution centered on a desired charge level. The variance of the distribution may be determined by the programming method as well as the physical properties of the memory cell. Consequently, the threshold voltage distributions of flash memory cells are also Gaussian.

FIG. 1 illustrates four threshold voltage distributions (herein "level distributions") for a 2-bit memory cell. The four level distributions depicted are associated with four different levels of charge that may be stored in a memory cell, each level distribution having its own mean and variance. As depicted in FIG. 1, the intersections of the four charge levels (level 0, level 1, level 2, and level 3) define three detection thresholds ($t1$, $t2$, and $t3$) That is, the three detection thresholds ($t1$, $t2$, and $t3$) are located where curves of two adjacent level distributions intersect.

In order to properly write and read data to and from a multi-level memory cell, two things should be known: the detection thresholds and the means of the level distributions of the multi-level memory cell. In particular, the detection thresholds (e.g., $t1$, $t2$, and $t3$) may be needed in order to read data from the memory cells, and the means (e.g., $m1$, $m2$, $m3$, and $m4$) of the level distributions may be needed in order to write data to the memory cell. That is, the detection thresholds are needed during a read operation of a multi-level memory cell in order to determine whether the charge stored in the memory cell is at level 0, level 1, level 2, or level 4. In contrast, the means of the level distributions are needed during a write operation of a multi-level memory cell in order to more accurately target the amount of charge to be programmed into the memory cell.

For example, in order to determine whether the total charge stored in a multi-level memory cell is in level 0 during a read operation, the value of the first detection threshold ($t1$) should be known. By knowing the value of $t1$, one would simply determine whether the charge stored (or not stored since level 0 could be zero charge) in the memory cell is less than $t1$ in order to determine whether the stored charge is at level 0. Similarly, in order to determine whether the charge stored in the memory cell is at level 1, you would determine whether the charge stored in the memory cell is between $t1$ and $t2$.

In contrast, in order to target the right amount of charge to program into a multi-level memory cell during a write operation, the means (herein "mean values") of the level distribution should be known. For example, referring back to FIG. 1, if one wanted to store level 2 amount of charge in the memory cell, one would need to know the second mean value ($m1$) in order to properly program the memory cell. By targeting $m1$ amount of charge to be stored in the memory cell, error may be minimized since $m1$ is located at the top of the Gaussian curve.

Unfortunately, memory cells, such as the multi-level flash memory cells described above, may be subject to retention loss after undergoing read and/or write cycling. As a result, the mean and variance of the level distributions change after cycling (e.g., read and write operations) as illustrated FIG. 2. In order to account for the degradation of such memory cells and to minimize error during read and write operations of such memory cells, memory read/write systems need to track not only the changes to the level distributions, but also to adaptively adjust the read and write processes to mitigate the detrimental effects of repeated cycling operations.

SUMMARY

According to various embodiments of the present invention, adaptive memory read and write systems and methods are provided that may adjust to level distributions changes of memory cells. In one aspect, this specification describes an apparatus including: a plurality of multi-level memory cells configured to store data, wherein one or more of the multi-level memory cells are designated as pilot memory cells, and wherein each pilot memory cell is configured to store known, pre-determined data; an estimation block configured to, based on the known, pre-determined data, determine (i) estimated mean values of level distributions of the multi-level memory cells and (ii) estimated standard deviation values of level distributions of the multi-level memory cells; and a computation block configured to compute at least optimal or near optimal detection threshold values of level distributions of the multi-level memory cells based, at least in part, on (i) the estimated mean values and (ii) the estimated standard deviation values, wherein the optimal or near optimal detection threshold values are to be used in order to facilitate reading of the data stored in the multi-level memory cells.

These and other aspects of various embodiments of the present will be described in greater detail in the following description.

BRIEF DESCRIPTION OF THE DRAWINGS

The present invention will be described by way of exemplary embodiments, but not limitations, illustrated in the accompanying drawings in which like references denote similar elements, and in which:

FIG. 1 illustrates four threshold voltage distributions of an exemplary 2-bit memory cell;

FIG. 2 illustrates the four threshold voltage distributions of the exemplary 2-bit memory cell of FIG. 1 after cycling;

FIG. 4 illustrates an exemplary table structure of a look-up table, in accordance with various embodiments of the present invention;

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of the instant description, the phrase "A/B" means A or B. For the purposes of the instant description, the phrase "A and/or B" means "(A), (B), or (A and B)." For the purposes of the instant description, the phrase "at least one of A, B and C" means "(A), (B), (C), (A and B), (A and C), (B and C) or (A, B and C)." For the purposes of the instant description, the phrase "(A)B" means "(B) or (AB)," that is, A is an optional element.

The description may use the phrases "in various embodiments," or "in some embodiments," which may each refer to one or more of the same or different embodiments. Further- more, the terms "comprising," "including," "having," and the like, as used with respect to embodiments of the present invention, are synonymous.

According to various embodiments of the present invention, adaptive read and write memory systems and methods are provided that may adapt to changes to level distributions of multi-level memory cells. In particular, the novel systems may be configured to compute new mean values of level distributions and/or new detection threshold values of multi-level memory cells (herein "memory cells") after the memory cells have degraded as a result of, for example, repeated cycling. For purposes of the following description, the computed new mean and detection threshold values will be referred to as "optimal or near optimal" values. That is, the phrase "optimal or near optimal" as used herein are in reference to the mew mean and detection threshold values that may be computed using either an optimal solution, which may be a more complex solution requiring more computational power, or a simpler near optimal (approximate) solution. As will be described herein, these values may be calculated whenever a read operation is performed on multi-level memory cells.

Figure 3:
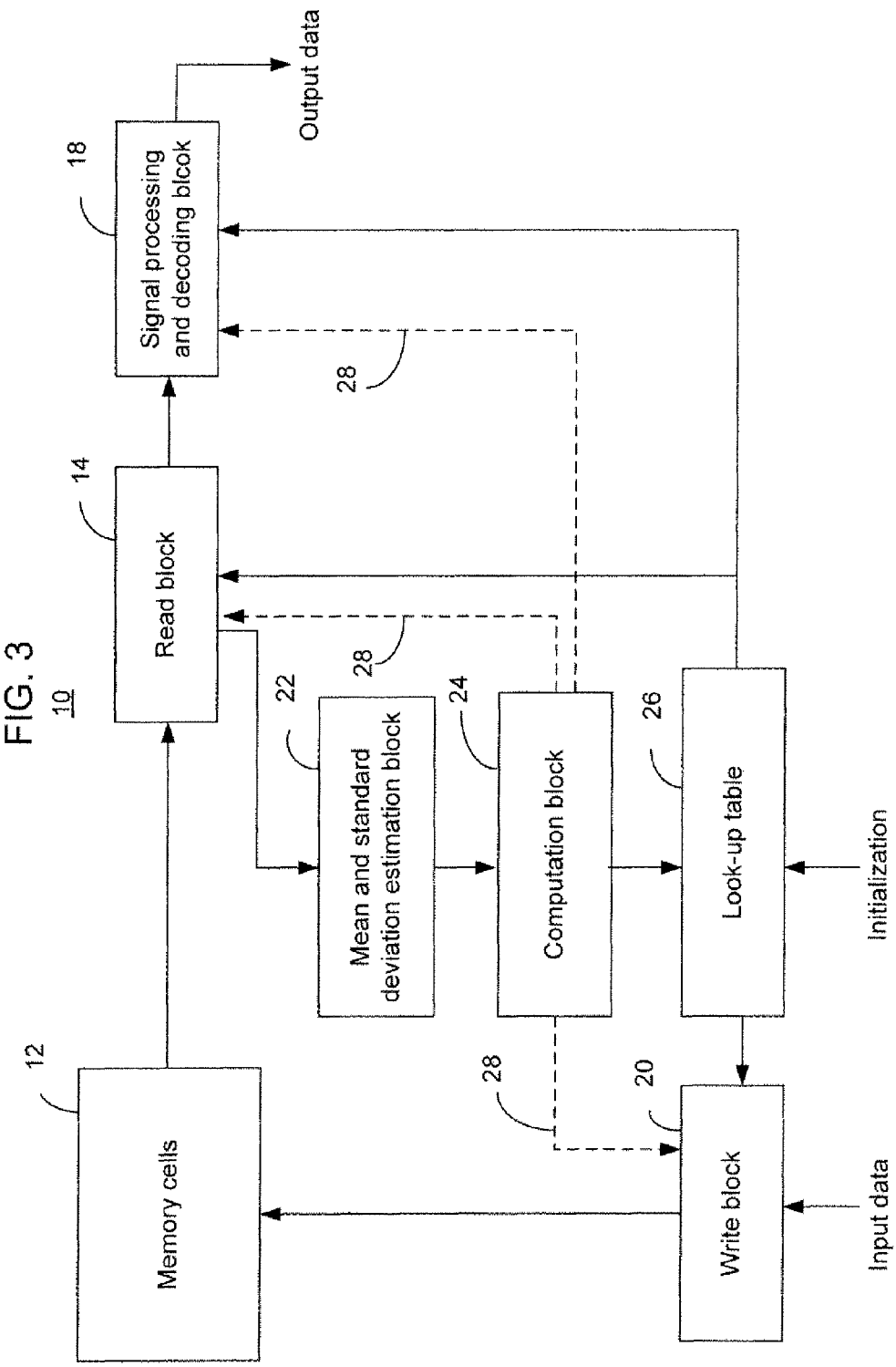
FIG. 3 illustrates an adaptive read/write memory system, in accordance with various embodiments of the present invention.

FIG. 3 depicts an adaptive read/write memory system in accordance with various embodiments of the present invention. The read/write memory system (herein "system") 10, as in conventional read/write memory systems, may include memory cells 12, which may be multi-level flash memory cells, a read block 14, a signal processing and decoding block 18, and write block 20. However, unlike conventional systems, the system 10 may further include a mean and standard deviation estimation block 22, a computation block 24, and a look-up table 26, operationally coupled together. One or more of the components depicted, such as the mean and standard deviation estimation block 22 and the computation block 24, may be implemented using hardware components, such as, for example, application specific integrated circuit (ASIC), and/or software.

In brief, and as will be described in greater detail herein, the mean and standard deviation estimation block (herein "estimation block") 22 may be configured to calculate estimated mean and standard deviation values of level distributions of the memory cells 12 during, for example, a read operation of the memory cells 12. The computation block 24 may be configured to compute optimal or near optimal mean and detection threshold values based on the estimated mean and standard deviation values provided by the estimation block 22. As will be described herein, the optimal or near optimal mean values computed may be used in order to adaptively write data into the memory cells 12 while the detection threshold values computed may be used in order to adaptively read data stored in the memory cells 12.

The optimal or near optimal mean and detection threshold values computed by the computation block 24 and the estimated mean and standard deviation values calculated by the estimation block 22, in various embodiments of the present invention, may be stored in the look-up table 26. The read block 14, the signal processing and decoding block 18, and the write block 20 may use selected values stored in and provided by the look-up table 26 to perform various operations. Alternatively, such values may be directly provided by the estimation block 22 and the computation block 24 as indicated by reference 28.

As briefly described above, the estimation block 22 may calculate estimated mean and standard deviation values of level distributions of the memory cells 12 during a read operation. The estimated mean and standard deviation values may be calculated as intermediate steps in order for the computation block 24 to eventually compute the optimal or near optimal mean and detection threshold values based, at least in part, on the estimated mean and standard deviation values. Estimated mean and standard deviation values may be calculated for each level distribution of a memory cell. In various embodiments and as will be described herein, the estimation of the mean and standard deviation values may be achieved via training or online adaptation.

For example, the estimated mean and standard deviation values may be calculated by using pilot memory cells having known or predetermined data. That is, certain memory cells 12 may be designated as pilot memory cells, where the data stored in these memory cells are predefined and known. The read block 14 may then exploit these pilot cells for estimating the mean and standard deviations as described in, for example, co-pending U.S. patent application Ser. No. 11/738,263, filed Apr. 20, 2007, entitled "Channel Estimation for Multi-Level Flash Memories Using Pilot Signals," which is hereby incorporated by reference in its entirety for all purposes. Such a method for estimating the mean and standard deviations (i.e., variances) of level distributions of a memory cell is referred to herein as a "training" technique. Alternatively, online adaptation techniques may be employed for estimating the mean and standard deviations. For instance, the LMS (least-mean-squares) algorithm may be used to estimate the mean and standard deviations based on the data recovered from the memory cells.

Based on the estimated mean and standard deviation values calculated by the estimation block 22, the computation block 24 may compute optimal or near optimal mean and detection threshold values for a memory cell or a group of memory cells. Specifics on how the optimal or near optimal mean and detection threshold values may be computed will be described in detail herein. The calculated optimal or near optimal mean and detection threshold values may then be stored in look-up table 26. An example of look-up table 26 is depicted in FIG. 4. In particular, FIG. 4 depicts an exemplary table structure 40 of look-up table 26 of FIG. 3, in accordance with various embodiments of the present invention.

In table structure 40, the "block index" column 41 on the far left is in reference to a block of memory cells. The second and third columns 42 and 43 from the left are for estimated mean and standard deviation values calculated by the estimation block 22. The two columns 44 and 45 on the right are for the optimal or near optimal mean and detection threshold values as computed by the computation block 24. Thus, in this example, a block or a group of memory cells may be associated with common estimated mean and standard deviation values, as well as common optimal or near optimal mean and detection threshold values.

Since a multi-level memory cell may have multiple level distributions, multiple estimated mean and standard deviation values, as well as multiple optimal or near optimal mean and detection threshold values may be calculated and stored in the table structure 40 for a memory cell (in this example, for each group of memory cells). Thus, for the second and third columns, the "estimated mean values" column and the "estimated standard deviations" column, there are multiple mean ($m_0, m_1, \ldots$) and standard deviation ($\sigma_0, \sigma_1, \ldots$) values for each of the multiple levels of a multi-level cell (see FIG. 1). Similarly, there may be multiple values included in the fourth and fifth columns 44 and 45 for the "near optimal mean values" and the "near optimal detection thresholds."

Although the computation block 24, in some embodiments of the present invention, may compute the optimal or near optimal mean and detection values as soon as the estimated mean and standard deviations are calculated by the estimation block 22, as appears to be case in the above described embodiment, in some alternative embodiments, the optimal or near optimal mean and detection threshold values may be computed at some later time after the estimated mean values and estimated standard deviation values have already been stored in the table 26.

As described previously, the optimal or near optimal detection threshold values computed may be used during a read operation of one or more multi-level memory cells. In using the optimal or near optimal detection threshold values, error resulting from reading a degraded memory cell as a result of repeated cycling may be minimized.

Figure 5:
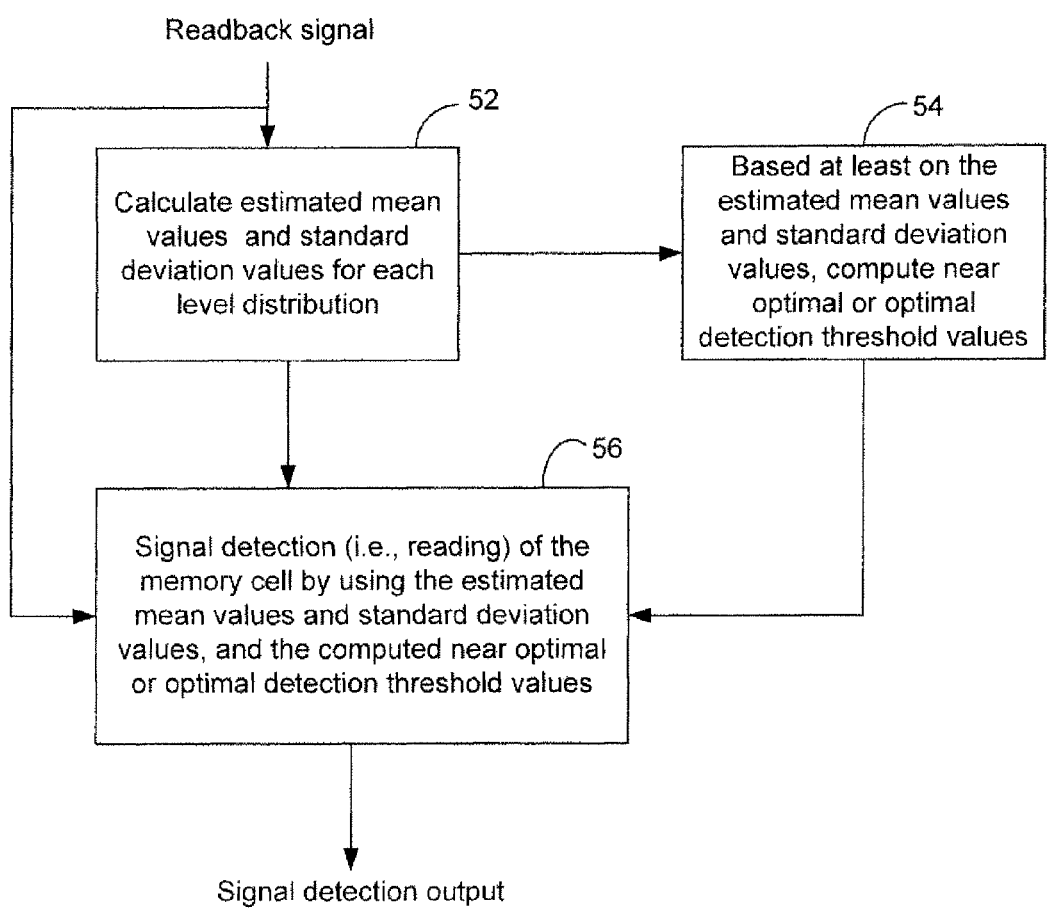
FIG. 5 illustrates an adaptive signal detection flow process for reading multi-level memory cells using computed optimal or near optimal detection threshold values, in accordance with various embodiments of the present invention.

Referring now to FIG. 5, an adaptive signal detection flow process for reading multi-level memory cells based, at least in part, on computed optimal or near optimal detection threshold values in accordance with various embodiments of the present invention is illustrated. The process 50 may begin when the latest estimated mean values and standard deviation values for level distributions of the multi-level memory cells are calculated at 52. The latest estimated mean values and standard deviation values may be calculated based on, for example, readback signals of pilot memory cells or online adaptation techniques as described previously.

Based at least on the estimated mean values and standard deviation values, optimal or near optimal detection threshold values may be computed at 54. The optimal or near optimal detection threshold values may be computed using a linear solution, which may be an approximate or near optimal solution, or Newton's method, which may be an optimal solution), both of which will be described in greater detail herein. Signal detection (i.e., reading) of the readback signal may then be performed using the estimated mean values and standard deviation values, and the computed near optimal detection threshold values at 56.

In contrast to the computed optimal or near optimal detection threshold values, the computed optimal or near optimal mean values may be used during a write operation to program a memory cell. That is, although optimal or near optimal mean values may be calculated (along with the near optimal detection threshold values) for a multi-level memory cell during or after a read operation of the multi-level memory cell, the optimal or near optimal mean values may not be used until a subsequent write (i.e., programming) operation of the memory cell. The computed optimal or near optimal mean values may be used to more reliably program multi-level memory cells during a write operation, particularly for example, those multi-level memory cells that have been repeatedly cycled.

Figure 6:
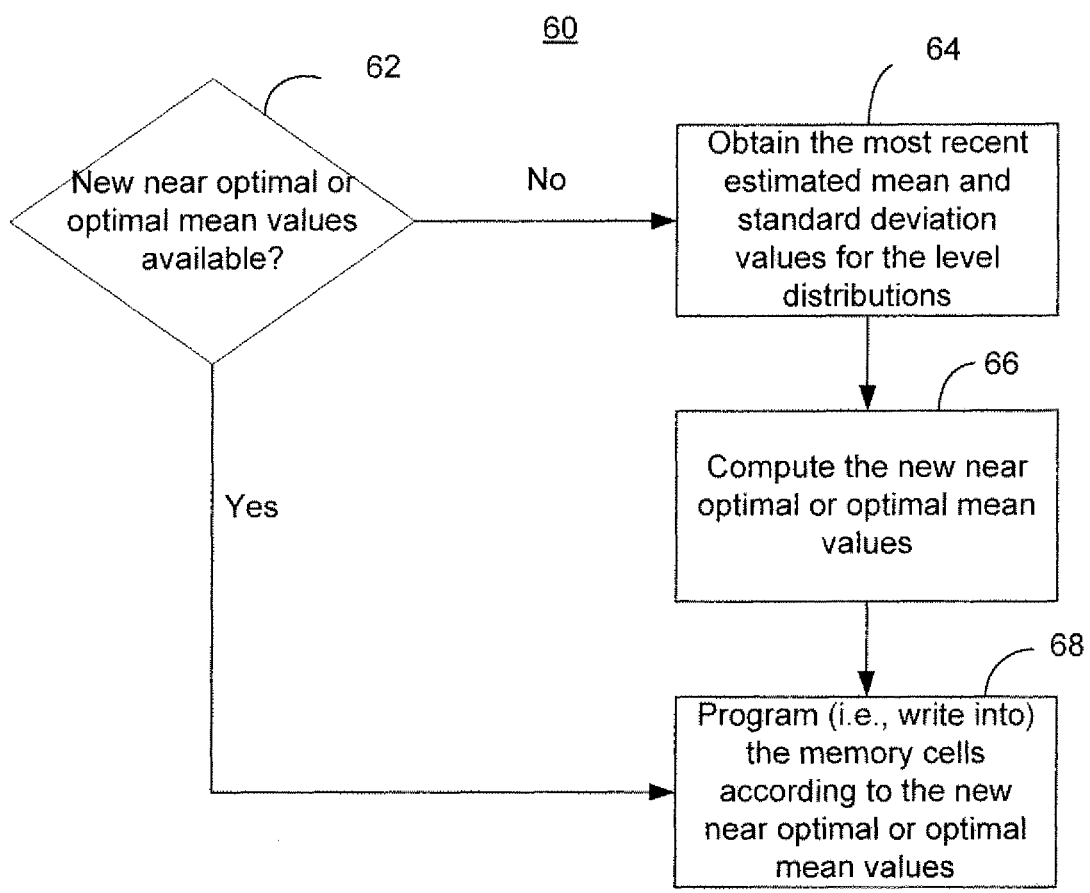
FIG. 6 illustrates an adaptive flow process for a write operation of multi-level memory cells, in accordance with various embodiments of the present invention.

FIG. 6 illustrates an adaptive flow process for a write operation of multi-level memory cells, according to various embodiments of the present invention. The process 60 may begin when a determination is made as to whether new optimal or near optimal mean values for the memory cells are available at 62. In some instances, new optimal or near optimal mean values for the memory cells may have already been calculated and stored, such as those that may be stored in look-up table 26. If so, the memory cells may be programmed (i.e., written) in accordance with the new optimal or near optimal mean values at 68. If not, then the most recent estimates of mean and standard deviation values for the level distributions of the memory cells are obtained either from the look-up table 26, or are calculated at 64. Based on the estimated mean and standard deviation values, new optimal or near optimal mean values are computed at 66 using a linear solution (i.e., near optimal solution) or Newton's method (i.e., optimal solution). After computing the optimal or near optimal mean values, the memory cells may be programmed (i.e., written) according to the optimal or near optimal mean values at 68.

In order to calculate optimal or near optimal mean and detection threshold values of multi-level memory cells, it is recognized that many parameters associated with multi-level memory cells including, for example, the means and standard deviations of the lowest and highest level distributions (e.g., the level distributions of level 0 and level 4 of FIG. 1) are functions of the memory cells and are not easily controllable. Given these values, however, it may be possible to optimize a read/write memory system by adjusting the means of level distributions (except for the means associated with the lowest and highest level distributions) during programming of the memory cells. In addition, for hard decision detection in a read operation, the detection threshold values may be optimized according to the current or most recent level distributions for minimum probability of error. In other words, optimal or near optimal mean and detection threshold values may be determined for write and read operations of multi-level memory cells in order to reduce error if certain parameters such as the means and standard deviations of the lowest and highest level distributions are assumed to be determined by the device characteristics.

Figure 7:
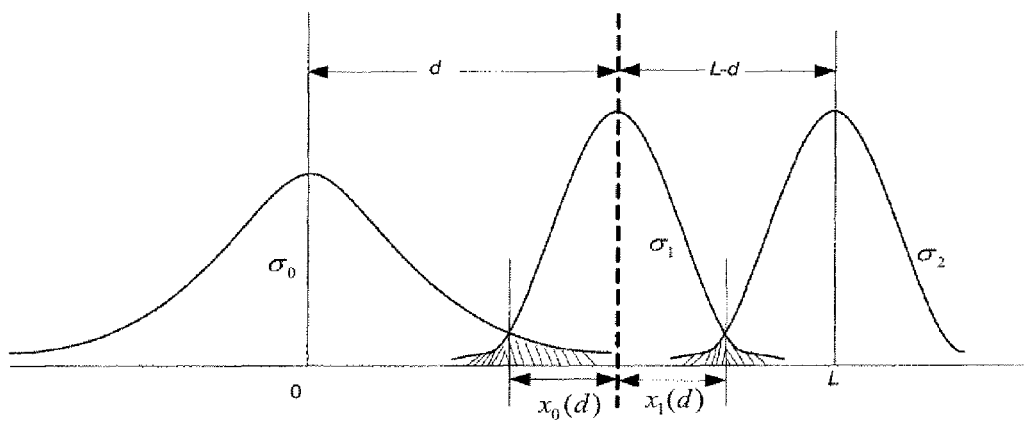
FIG. 7 illustrates a 3-level threshold voltage distribution ("3-level distribution") of an exemplary multi-level memory cell, in accordance with various embodiments of the present invention.

In order to obtain an optimal solution for computing optimal mean and detection threshold values, reference is now made to FIG. 7, which depicts an exemplary 3-level threshold voltage distribution ("3-level distribution"). For this example, the respective standard deviations for the 3 level distributions are $\sigma_0$, $\sigma_1$, and $\sigma_2$. For purposes of illustration, assume that the level distribution means fall in the range between 0 and L, where L is the distance or range between the mean of the lowest level distribution (i.e., the left-most level distribution in FIG. 7) and the mean of the highest level distribution (i.e., the right-most level distribution in FIG. 7). Then the mean of the middle level distribution may be denoted by d. Once d is given, the crossing points of the probability density functions (pdf's) may also be determined. In this example the distances of the crossing points from d are denoted by $x_0(d)$ and $x_1(d)$, respectively.

From signal detection theory, it is known that the optimal detection thresholds for multi-level memory cells are the crossing points of the pdf's. In the following, the pdf's are first shown to maintain the same value at the crossing points (i.e., detection thresholds) when minimum probability of error is achieved. The shaded areas in FIG. 7 correspond to the error regions. It is not difficult to see that the probability of making an error in detection is given by $$P_e = \int_{\frac{d-x_0(d)}{\sigma_0}}^{\infty} N(0,1) + \int_{\frac{x_0(d)}{\sigma_1}}^{\infty} N(0,1) + \int_{\frac{x_1(d)}{\sigma_1}}^{\infty} N(0,1) + \int_{\frac{L-d-x_1(d)}{\sigma_2}}^{\infty} N(0,1)$$

where $N(0,1)$ denotes the standard Gaussian distribution function with zero mean and variance 1. Taking the derivative of $P_e$ with respect to d, it follows that $$\frac{\partial P_e}{\partial d} = 0 = g\left(\frac{d - x_0(d)}{\sigma_0}\right) \cdot \frac{1}{\sigma_0} \cdot \frac{\partial(d - x_0(d))}{\partial d} + \quad \text{Eq. (1)}$$

$$g\left(\frac{x_0(d)}{\sigma_1}\right) \cdot \frac{1}{\sigma_1} \cdot \frac{\partial(x_0(d))}{\partial d} + g\left(\frac{x_1(d)}{\sigma_1}\right) \cdot \frac{1}{\sigma_1} \cdot \frac{\partial(x_1(d))}{\partial d} +$$

-continued $$g\left(\frac{L - d - x_1(d)}{\sigma_2}\right) \cdot \frac{1}{\sigma_2} \cdot \frac{\partial(L - d - x_1(d))}{\partial d}$$

where $g(x) = \frac{1}{\sqrt{2\pi}} e^{-x^2/2}$.

Noting that $$g\left(\frac{d - x_0(d)}{\sigma_0}\right) \cdot \frac{1}{\sigma_0} = g\left(\frac{x_0(d)}{\sigma_1}\right) \cdot \frac{1}{\sigma_1}$$

and $$g\left(\frac{x_1(d)}{\sigma_1}\right) \cdot \frac{1}{\sigma_1} = g\left(\frac{L - d - x_1(d)}{\sigma_2}\right) \cdot \frac{1}{\sigma_2}$$

to obtain $$g\left(\frac{d - x_0(d)}{\sigma_0}\right) \cdot \frac{1}{\sigma_0} = g\left(\frac{L - d - x_1(d)}{\sigma_2}\right) \cdot \frac{1}{\sigma_2}$$

The above equation is the result after canceling out the equal terms in Eq. (1). This completes the proof. Extensions to more than 3 levels are similar. For ease of reference, the above property will be referred to, herein, as "Equal Value Property."

Figure 8:
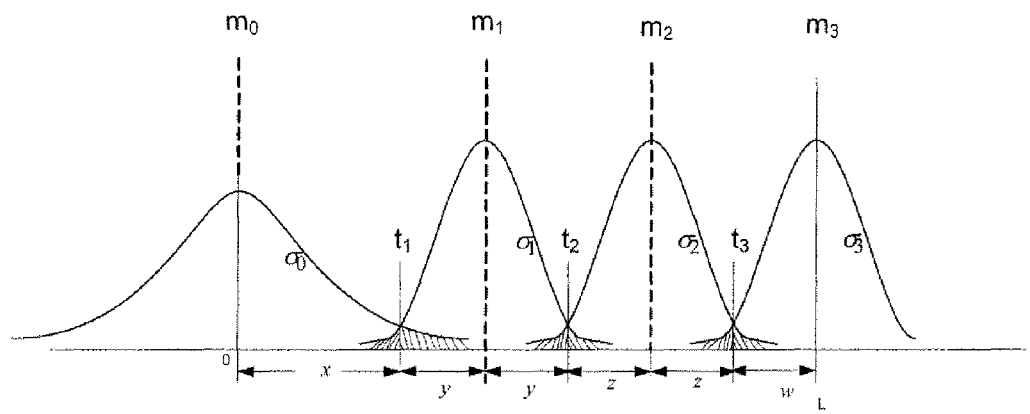
FIG. 8 illustrates a 4-level threshold voltage distribution ("4-level distribution) of an exemplary multi-level memory cell, in accordance with various embodiments of the present invention.

As an example, the "Equal Value Property" may be used to solve the optimization problem for a 4-level distribution, which is depicted in FIG. 8. For the 4-level distribution example depicted in FIG. 8, the mean range is between 0 and L, the means of the level distributions are denoted as $m_0$, $m_1$, $m_2$, and $m_3$, the detection thresholds for the level distributions are denoted as $t_1$, $t_2$, and $t_3$, and the respective standard deviations of the level distributions are denoted as $\sigma_0$, $\sigma_1$, $\sigma_2$, and $\sigma_3$. The distances between the means and the detection thresholds, as depicted, are x, y, z, and w. In order to determine the optimal solutions for x, y, z, and w, the following set of equations may be used:

$$\begin{cases} \frac{1}{\sigma_0} e^{-\frac{x^2}{2\sigma_0^2}} = \frac{1}{\sigma_1} e^{-\frac{y^2}{2\sigma_1^2}} = \frac{1}{\sigma_2} e^{-\frac{z^2}{2\sigma_2^2}} = \frac{1}{\sigma_3} e^{-\frac{w^2}{2\sigma_3^2}} \\ x + 2y + 2z + w = L. \end{cases}$$

Numerical approaches may be used to solve the above equations. For example, the constraint in Eq. (2) may be integrated into Eq. (3) by defining a constant C viz:

$$\begin{cases} \frac{1}{\sigma_0} e^{-\frac{x^2}{2\sigma_0^2}} = \frac{1}{\sigma_1} e^{-\frac{y^2}{2\sigma_1^2}} = \frac{1}{\sigma_2} e^{-\frac{z^2}{2\sigma_2^2}} = \frac{1}{\sigma_3} e^{-\frac{w^2}{2\sigma_3^2}} = C \quad \text{Eq. (4)} \\ x + 2y + 2z + w = L \end{cases}$$

Now, C may be found by using Newton's method to solve $$f(x) = x + 2y + 2z + w - L$$
$$= g(\sigma_0, C) + 2g(\sigma_1, C) + 2g(\sigma_2, C) + g(\sigma_3, C) - L.$$

where $g(\sigma, C) = \sigma\sqrt{-2\ln(\sigma C)}$

After taking the derivative of f(x) with respect to C, the following is obtained:

$$df(x)/dC = d(x+2y+2z+w-L)/dC$$

$$= \frac{-\sigma_0}{g(\sigma_0, C)} + \frac{-2\sigma_1}{g(\sigma_1, C)} + \frac{-2\sigma_2}{g(\sigma_2, C)} + \frac{-\sigma_3}{g(\sigma_3, C)}.$$

Now, C can be found through the following iteration $$C_{n+1} = C_n - \frac{f(C_n)}{f'(C_n)}.$$

The solution converges very fast for good initial values of C. Once C is solved, the x, y, z, and w values may easily follow. Thus, equation (2) and (3) may be used in order to obtain what has been referred to previously as, the optimal solution.

Although, the above solution may be very accurate, approximations may be used to simplify the computation and obtain a near optimal solution. For example, taking the logarithm of the first equation of Eq. (2), the following may be obtained:

$$\frac{x^2}{2\sigma_0^2} = \frac{y^2}{2\sigma_1^2} + \ln\left(\frac{\sigma_1}{\sigma_0}\right). \quad \text{Eq. (5)}$$

Note that for practical applications, the ratio between $\sigma_1$ and $\sigma_0$ is close to 1, which after taking the logarithm are negligible comparing to other terms in Eq. (5). Ignoring the term $$\ln\left(\frac{\sigma_1}{\sigma_0}\right),$$

it follows that $$\frac{x}{\sigma_0} = \frac{y}{\sigma_1}.$$

Similar approximations also hold true for z and w. Thus, the near optimal solutions may be obtained as $$\begin{cases} x = \frac{\sigma_0}{\sigma_0 + 2\sigma_1 + 2\sigma_2 + \sigma_3} L \\ y = \frac{\sigma_1}{\sigma_0 + 2\sigma_1 + 2\sigma_2 + \sigma_3} L \\ z = \frac{\sigma_2}{\sigma_0 + 2\sigma_1 + 2\sigma_2 + \sigma_3} L \\ w = \frac{\sigma_3}{\sigma_0 + 2\sigma_1 + 2\sigma_2 + \sigma_3} L \end{cases}.$$

These solutions may be referred to, for purposes of this description as linearized solutions and they are near optimal under practical operating conditions. That is, once x, y, z, and w are solved, approximate (i.e., near optimal) solutions may be determined for the mean and detection threshold values of 4-level memory cells. It should be noted, however, that the above formulation may be easily extended to any M number of levels for M≥2.

Based on the above near optimal solution, and once the estimated mean and standard deviations for all the distributions have been determined using, for example, pilot cells, it may be straightforward to find the near optimal detection threshold values. For example, if the estimated mean and standard deviation values of the level distributions for a 4-level (2 bit/cell) flash memory device are found to be $\{m_i, i=0, 1, 2, 3\}$ and $\{\sigma_i, i=0, 1, 2, 3\}$, respectively. Utilizing the linearized solution (i.e., near optimal solution), one may obtain:

$$\begin{cases} t_1 = \frac{m_1 \sigma_0 + m_0 \sigma_1}{\sigma_0 + \sigma_1} \\ t_2 = \frac{m_2 \sigma_1 + m_1 \sigma_2}{\sigma_1 + \sigma_2} \\ t_3 = \frac{m_3 \sigma_2 + m_2 \sigma_3}{\sigma_2 + \sigma_3} \end{cases}$$

where $t_1$, $t_2$ and $t_3$ are the near optimal signal detection thresholds. Thus, the near optimal detection thresholds, $t_1$, $t_2$ and $t_3$, of a 4-level multi-level memory may be solved using the above equations. If more accuracy is desired, exact solutions may always be found by utilizing the Equal Value Property through the Newton's method illustrated previously.

The near optimal mean values for multi-level memory cells may be obtained as follows. For a M level memory cell, assume that the estimated voltage means are denoted as $\{m_i, i=0, 1, \ldots M-1\}$ and the corresponding standard deviations as $\{\sigma_i, i=0, 1, \ldots, M-1\}$. Due to physical reasons and as previously alluded to, the mean values corresponding to the lowest ($m_0$) and highest levels ($m_{M-1}$) and the standard deviations are not easily controllable, thus such values are assumed to be predefined and set. However, the values of $m_i, i=1, 2, \ldots, M-2$ may be adjusted for optimal performance. By denoting $L = m_{M-1} - m_0$ and utilizing the linearized solutions, the near optimal mean value ($\tilde{m}$) for the i-th level is given by $$\tilde{m}_i = m_0 + \frac{\sigma_0 + 2\sum_{k=1}^{i-1} \sigma_k + \sigma_i}{\sigma_0 + 2\sum_{k=1}^{M-2} \sigma_k + \sigma_{M-1}} L \quad \text{Eq. (6)}$$

Thus, the above equation may be used to solve for near optimal mean values of M-level distribution memory cells in accordance with various embodiments of the present invention. Alternatively, the Newton's method may be used for more accuracy.

Although specific embodiments have been illustrated and described herein, it will be appreciated by those of ordinary skill in the art and others, that a wide variety of alternate and/or equivalent implementations may be substituted for the specific embodiments illustrated and described without departing from the scope of the present invention. This application is intended to cover any adaptations or variations of the embodiments discussed herein. Therefore, it is manifested and intended that various embodiments of the invention be limited only by the claims and the equivalents thereof.

What is claimed is:

1. An apparatus, comprising:
a plurality of multi-level memory cells configured to store data, wherein one or more of the multi-level memory cells are designated as pilot memory cells, and wherein each pilot memory cell is configured to store known, pre-determined data;

an estimation block configured to, based on the known, pre-determined data stored in the one or more pilot memory cells, determine (i) estimated mean values of level distributions of the multi-level memory cells and (ii) estimated standard deviation values of level distributions of the multi-level memory cells; and a computation block operatively coupled to the estimation block, wherein the computation block is configured to, based at least in part on (i) the estimated mean values of level distributions of the multi-level memory cells and (ii) the estimated standard deviation values of level distributions of the multi-level memory cells, compute (i) detection threshold values associated with crossing points of level distributions of the multi-level memory cells and (ii) mean values of level distributions of the multi-level memory cells, wherein the detection threshold values associated with the crossing points are to be used in order to facilitate reading of the data stored in the multi-level memory cells, and wherein the mean values of level distributions of the multi-level memory cells are to be used to minimize write error probabilities for writes to the multi-level memory cells.

2. The apparatus of claim 1, wherein the detection threshold values associated with the crossing points are optimal or near optimal detection threshold values of an M-level memory cell that are computed according to the equation:

$$t_i = \frac{m_{i-1}\sigma_i + m_i\sigma_{i-1}}{\sigma_i + \sigma_{i-1}}$$

for $1 \leq i \leq M-1$, where $t_i$ is the detection threshold between level i−1 and level i; $m_i, 0 \leq i \leq M-1$ are the estimated means of the M-level distributions; and $\sigma_i, 0 \leq i \leq M-1$ are the estimated standard deviations of the M-level distributions.

3. The apparatus of claim 1, further comprising a read block configured to read the data stored in the multi-level memory cells based, at least in part, on the detection threshold values associated with the crossing points.

4. The apparatus of claim 1, further comprising a look-up table configured to provide the detection threshold values associated with the crossing points to the read block.

5. The apparatus of claim 4, further comprising a signal processing and decoding block configured to receive the detection threshold values associated with the crossing points from the look-up table, the detection threshold values associated with the crossing points to be used by the signal processing and decoding block to facilitate processing and decoding of the data read from the multi-level memory cells.

6. The apparatus of claim 1, wherein the multi-level memory cells are M-level memory cells, where M is greater than or equal to 2.

7. The apparatus of claim 1, wherein the multi-level memory cells are multi-level flash memory cells.

8. An apparatus, comprising:
multi-level memory cells including at least one M level memory cell having M levels; and
a computation block configured to compute optimal or near optimal mean values of level distributions of the multi-level memory cells based, at least in part, on (i) estimated mean values of level distributions of the multi-level memory cells and (ii) estimated standard deviation values of level distributions of the multi-level memory cells, wherein an $i^{th}$ level optimal or near optimal mean value ($\tilde{m}_i$) of the M level memory cell is computed according to the equation $$\tilde{m}_i = m_0 + \frac{\sigma_0 + 2\sum_{k=1}^{i-1} \sigma_k + \sigma_i}{\sigma_0 + 2\sum_{k=1}^{M-2} \sigma_k + \sigma_{M-1}} L$$

wherein $m_i$ is the estimated mean value of the $i^{th}$ level of the M level memory cell, $\sigma_i$ is the estimated standard deviation value of the $i^{th}$ level of the M level memory cell, and L is equal to $m_{M-1} - m_0$, and wherein at least one of the estimated standard deviation values $\sigma_0, \ldots, \sigma_{M-1}$ is non-zero.

9. The apparatus of claim 8, further comprising a look-up table configured to store the estimated mean and standard deviation values and the optimal or near optimal mean values.

10. The apparatus of claim 8, wherein:
the computation block is further configured to compute optimal or near optimal detection threshold values based, at least in part, on (i) the estimated mean values and (ii) the estimated standard deviation values, and
(i) the optimal or near optimal mean values and (ii) the optimal or near optimal detection threshold values are to be used to facilitate writing and reading, respectively, of data to and from the multi-level memory cells.

11. The apparatus of claim 10, further comprising a read block configured to read data from the multi-level memory cells, the reading of the data being based, at least in part, on the optimal or near optimal detection threshold values.

12. The apparatus of claim 11, further comprising a write block configured to write data to the multi-level memory cells, the writing of the data based, at least in part, on the optimal or near optimal mean values.

13. The apparatus of claim 11, wherein the computation block is further configured to compute the optimal or near optimal detection threshold values of the M-level memory cell according to the equation:

$$t_i = \frac{m_{i-1}\sigma_i + m_i\sigma_{i-1}}{\sigma_i + \sigma_{i-1}}$$

for $1 \leq i \leq M-1$, where $t_i$ is the detection threshold between level i−1 and level i; $m_i, 0 \leq i \leq M-1$ are the estimated means of the M-level distributions; and $\sigma_i, 0 \leq i \leq M-1$ are the estimated standard deviations of the M-level distributions.

14. A method, comprising:
estimating (i) mean values of level distributions of a multi-level memory cells and (ii) standard deviation values of level distributions of the multi-level memory cells; and
computing optimal or near optimal mean values of level distributions of the multi-level memory cells based, at least in part, on (i) the estimated mean values and (ii) the estimated standard deviation values, the optimal or near optimal mean values to be used to facilitate writing of data to the multi-level memory cells, wherein the multi-level memory cells include at least one M level memory cell having M levels, and said computing comprises computing an $i^{th}$ level near optimal mean value ($\tilde{m}$) of the M level memory cell according to the equation $$\tilde{m}_i = m_0 + \frac{\sigma_0 + 2\sum_{k=1}^{i-1}\sigma_k + \sigma_i}{\sigma_0 + 2\sum_{k=1}^{M-2}\sigma_k + \sigma_{M-1}} L$$

wherein $m_i$ is the estimated mean value of the $i^{th}$ level of the M level memory cell, $\sigma_i$ is the estimated standard deviation value of the $i^{th}$ level of the M level memory cell, and L is equal to $m_{M-1} - m_0$, and wherein at least one of the estimated standard deviation values $\sigma_0, \ldots, \sigma_{M-1}$ is non-zero.

15. The method of claim 14, wherein the multi-level memory cells include one or more pilot cells for storing predetermined data, and said determining comprises determining the estimated mean and standard deviation values by using the one or more pilot cells.

16. The method of claim 15, further comprising computing optimal or near optimal detection threshold values of level distributions of the multi-level memory cells based, at least in part, on (i) the estimated mean values and (ii) the estimated standard deviation values, the optimal or near optimal detection threshold values to be used to facilitate reading of data from the multi-level memory cells.

17. The method of claim 16, wherein said computing the optimal or near optimal detection threshold values further comprises computing the optimal or near optimal detection threshold values of the M-level memory cell according to the equation:

$$t_i = \frac{m_{i-1}\sigma_i + m_i\sigma_{i-1}}{\sigma_i + \sigma_{i-1}}$$

for $1 \leq i \leq M-1$, where $t_i$ is the detection threshold between level $i-1$ and level $i$; $m_i, 0 \leq i \leq M-1$ are the estimated means of the M-level distributions; and $\sigma_i, 0 \leq i \leq M-1$ are the estimated standard deviations of the M-level distributions.

18. The method of claim 17, further comprising reading data from the multi-level memory cells based, at least in part, on the optimal or near optimal detection threshold values.

19. The method of claim 18, further comprising storing the optimal or near optimal detection threshold values to a lookup table, and said reading of data from the multi-level memory cells comprises using the optimal or near optimal detection threshold values stored in the lookup table to facilitate said reading of the data in the multi-level memory cells.

* * * * *